United States Patent
Toihara

(10) Patent No.: US 7,008,688 B2
(45) Date of Patent: Mar. 7, 2006

(54) HARD MULTILAYER COATING, HARD MULTILAYER COATED TOOL INCLUDING THE HARD MULTILAYER COATING, AND METHOD OF FORMING THE HARD MULTILAYER COATING

(75) Inventor: Takaomi Toihara, Toyohashi (JP)

(73) Assignee: OSG Corporation, Toyokawa (JP)

( * ) Notice: Subject to any disclaimer, the term of this patent is extended or adjusted under 35 U.S.C. 154(b) by 299 days.

(21) Appl. No.: 10/091,537

(22) Filed: Mar. 7, 2002

(65) Prior Publication Data

US 2002/0132141 A1 Sep. 19, 2002

(30) Foreign Application Priority Data

Mar. 13, 2001 (JP) ........................ 2001-070822

(51) Int. Cl.
*B32B 9/00* (2006.01)

(52) U.S. Cl. ................. 428/216; 428/336; 428/697; 428/698

(58) Field of Classification Search ................ 428/216, 428/336, 697, 698
See application file for complete search history.

(56) References Cited

U.S. PATENT DOCUMENTS 5,503,912 A * 4/1996 Setoyama et al.
5,882,777 A * 3/1999 Kukino et al.
6,220,797 B1 * 4/2001 Ishii et al.
6,492,011 B1 * 12/2002 Brandle et al.

FOREIGN PATENT DOCUMENTS

| JP | A 4-226808 | 8/1992 |
| JP | B 5-67705 | 9/1993 |
| JP | A 7-97676 | 4/1995 |
| JP | A 8-104976 | 4/1996 |
| JP | A-09-031628 | 2/1997 |
| JP | B-2718731 | 11/1997 |
| JP | A 10-168583 | 6/1998 |
| JP | A-11-505573 | 5/1999 |
| JP | A 11-216601 | 8/1999 |
| JP | A-2000-026195 | 1/2000 |
| JP | A-2000-052018 | 2/2000 |
| JP | A-2000-144376 | 5/2000 |
| JP | A 2000-233324 | 8/2000 |
| JP | A-2001-198723 | 7/2001 |
| WO | WO 97/34023 | 9/1997 |

* cited by examiner

*Primary Examiner*—Archene Turner
(74) *Attorney, Agent, or Firm*—Oliff & Berridge, PLC

(57) ABSTRACT

A hard multilayer coating which is to be disposed on a surface of a substrate, including at least one first coating layer and at least one second coating layer which are alternately superposed on each other, wherein each of the at least one first coating layer consists of $(Ti_x Al_{1-x})(C_y N_{1-y})$ wherein $0.20 \leq x \leq 0.60$, $0 \leq y \leq 0.5$, while each of the at least one second coating layer includes CrN, and wherein one of the at least one first coating layer constitutes an outermost layer of the hard multilayer coating.

3 Claims, 4 Drawing Sheets

FIG. 4

| Sample | No. | Coating ($Ti_x Al_{1-x}$)($C_y N_{1-y}$) layer | | | CrN mixture layer | Number of layers | Total thickness ($\mu m$) | Chipping | Worn width in peripheral flank faces (mm) |
|---|---|---|---|---|---|---|---|---|---|
| | | x | y | Thickness (nm) | Thickness (nm) | | | | |
| Examples of the invention | 1 | 0.5 | 0 | 430/500 | 50 | 11 | 2.9 | LITTLE | 0.038 |
| | 2 | 0.5 | 0 | 440/500 | 100 | 11 | 3.2 | LITTLE | 0.075 |
| | 3 | 0.5 | 0 | 240/300 | 200 | 11 | 2.5 | SOME | 0.043 |
| | 4 | 0.5 | 0 | 290/330 | 500 | 7 | 2.7 | SOME | 0.048 |
| | 5 | 0.5 | 0 | 960/1040 | 1000 | 3 | 3.0 | SOME | 0.099 |
| | 6 | 0.5 | 0 | 520/620 | 100 | 9 | 3.1 | LITTLE | 0.037 |
| | 7 | 0.5 | 0 | 310/370 | 500 | 7 | 2.8 | SOME | 0.041 |
| | 8 | 0.5 | 0 | 160/180 | 100 | 25 | 3.3 | LITTLE | 0.04 |
| | 9 | 0.5 | 0 | 950/1000 | 100 | 5 | 3.1 | SOME | 0.052 |
| | 10 | 0.4 | 0 | 340/380 | 20 | 15 | 2.9 | LITTLE | 0.032 |
| | 11 | 0.4 | 0 | 460/520 | 500 | 7 | 3.4 | SOME | 0.046 |
| | 12 | 0.2 | 0 | 390/450 | 100 | 11 | 2.9 | SOME | 0.102 |
| | 13 | 0.2 | 0 | 360/420 | 500 | 7 | 3.0 | SOME | 0.092 |
| | 14 | 0.5 | 0.2 | 420/500 | 100 | 11 | 3.1 | SOME | 0.098 |
| | 15 | 0.5 | 0.5 | 580/640 | 500 | 5 | 2.8 | SOME | 0.108 |
| Comparative Examples | 16 | — | — | 0 | 2200 | 1 | 2.2 | LITTLE | 0.39 |
| | 17 | — | — | 0 | 3900 | 1 | 3.9 | LITTLE | 0.45 |
| Conventional Examples | 18 | 0.4 | 0 | 2900 | 0 | 1 | 2.9 | MUCH | 0.211 |
| | 19 | 0.5 | 0 | 3400 | 0 | 1 | 3.4 | MUCH | 0.168 |
| | 20 | 0.8 | 0 | 3100 | 0 | 1 | 3.1 | MUCH | 0.322 |

HARD MULTILAYER COATING, HARD MULTILAYER COATED TOOL INCLUDING THE HARD MULTILAYER COATING, AND METHOD OF FORMING THE HARD MULTILAYER COATING

BACKGROUND OF THE INVENTION

1. Field of the Invention

The present invention relates in general to a hard multilayer coating, and more particularly to such a hard multilayer coating having excellent wear resistance and tenacity.

2. Discussion of the Related Art

There is known a coated tool in which a tool substrate made of a cemented carbide or other material is coated at its surface with a hard coating formed of TiAlN. As an example of such a coated tool, JP-A-10-168583 (publication of unexamined Japanese Patent Application laid open in 1998) discloses a tool in which an interface layer formed of a relatively soft material such as CrN is interposed between the tool substrate and the hard coating formed of TiAlN, for the purpose of increasing a degree of adhesive or bonding strength with which the hard coating is bonded to the tool substrate. Further, JP-A-11-216601 (publication of unexamined Japanese Patent Application laid open in 1999) discloses a hard multilayer coating consisting of two types of TiAlN hard coating layers which have respective mixed compositions different from each other in crystal proportions of Ti and Al and which are alternately laminated.

However, since the TiAlN hard coating has a poor tenacity due to a large internal stress therein, the hard coating is likely to be chipped or separated from the tool substrate during a cutting operation, thereby making it impossible to sufficiently exhibit an excellent wear resistance of TiAlN. The provision of an interface layer or the superposing of two types of TiAlN hard coating layers which are different from each other in their mixed crystal proportions might somewhat prevents the chipping and separation, but does not satisfactorily prevents the chipping and separation.

SUMMARY OF THE INVENTION

The present invention was made in view of the background prior art discussed above. It is therefore a first object of the present invention to provide a hard multilayer coating which is constituted principally by TiAlN, and which is improved in its tenacity without deteriorating its wear resistance so that the hard multilayer coating is prevented to be chipped and separated from a substrate. This first object may be achieved according to any one of first through fourth aspects of the invention which are described below.

It is a second object of the invention to provide a hard multilayer coated tool which includes the hard multilayer coating having the technical advantage as described above. This second object may be achieved according to fifth aspect of the invention which is described below.

It is a third object of the invention to provide a method of forming the hard multilayer coating having the technical advantage as described above. This third object may be achieved according to any one of sixth through eighth aspects of the invention which are described below.

The first aspect of this invention provides a hard multilayer coating comprising at least one first coating layer and at least one second coating layer which are alternately superposed on each other, wherein each of the at least one first coating layer consists of $(Ti_x Al_{1-x})(C_y N_{1-y})$ wherein $0.20 \leq x \leq 0.60$, $0 \leq y \leq 0.5$, while each of the at least one second coating layer includes CrN, and wherein one of the at least one first coating layer constitutes an outermost layer of the hard multilayer coating.

According to the second aspect of the invention, in the hard multilayer coating defined in the first aspect of the invention, the above-described at least one first coating layer consists of a plurality of first coating layers, one of which constitutes an innermost layer of the hard multilayer coating.

According to the third aspect of the invention, in the hard multilayer coating defined in the first or second aspect of the invention, each of the at least one first coating layer has an average thickness of 10–2000 nm while each of the at least one second coating layer has an average thickness of 10–1000 nm, and wherein the hard multilayer coating has a total thickness of 0.5–20 μm.

According to the fourth aspect of the invention, in the hard multilayer coating defined in any one of the first though third aspects of the invention, each of the at least one second coating layer further includes $(Ti_x Al_{1-x})(C_y N_{1-y})$ wherein $0.20 \leq x \leq 0.60$, $0 \leq y \leq 0.5$, so that the second coating layer has a composition of mixture of CrN and $(Ti_x Al_{1-x})(C_y N_{1-y})$.

The fifth aspect of the invention provides a hard multilayer coated tool comprising: the hard multilayer coating defined in any one of the first through fourth aspects of the invention; and a substrate having a surface coated with the hard multilayer coating.

The sixth aspect of the invention provides a method of forming the hard multilayer coating defined in any one of the first through fourth aspects of the invention, on a surface of a substrate, by using an arc-type ion plating apparatus which includes: (a) a first arc-discharge power source for supplying an arc current to a first cathode formed of $Ti_x Al_{1-x}$ wherein $0.20 \leq x \leq 0.60$; (b) a second arc-discharge power source for supplying an arc current to a second cathode formed of Cr; (c) a bias-voltage power source for applying a negative bias voltage to the substrate; (d) a rotary device for rotating the substrate about a predetermined axis; and (e) a reaction-gas supplying device for introducing a reaction gas into a chamber which accommodates therein the substrate and the first and second cathodes. The method comprises a switching step of switching on and off the first and second arc-discharge power sources such that the first and second coating layers are alternately superposed on each other, wherein a thickness of the first coating layer is adjusted by controlling at least one of a time for which the first arc-discharge power source is held on, and the arc current supplied from the first arc-discharge power source, and wherein a thickness of the second coating layer is adjusted by controlling at least one of a time for which the second arc-discharge power source is held on, and the arc current supplied from the second arc-discharge power source.

According to the seventh aspect of the invention, in the method defined in the sixth aspect of the invention, the switching step includes a simultaneously switching step for switching on both of the first and second arc-discharge power sources such that each of the at least one second coating layer has a composition consisting of a mixture of the CrN and $(Ti_x Al_{1-x})(C_y N_{1-y})$ wherein $0.20 \leq x \leq 0.60$, $0 \leq y \leq 0.5$, and wherein proportions of the CrN and the $(Ti_x Al_{1-x})(C_y N_{1-y})$ in the composition are adjusted by controlling an amount of the arc current supplied from the first arc-discharge power source and an amount of the arc current supplied from the second arc-discharge power source.

According to the eight aspect of the invention, in the method defined in the sixth or seventh aspect of the invention, the first and second cathodes are positioned on respective opposite sides of the substrate in a direction perpendicular to the predetermined axis about which the substrate is rotated by the rotary device.

In the hard multilayer coating defined in the first aspect of the invention, $(Ti_x Al_{1-x}) (C_y N_{1-y})$ (wherein $0.20 \leq x \leq 0.60$, $0 \leq y \leq 0.5$) constituting the first coating layer has a hardness (Hv) of about 2300–3000, while CrN constituting the second coating layer has a hardness (Hv) of about 1800–2000. Thus, the hard multilayer coating, in which the first coating layer having the relatively high degree of hardness and the second coating layer having the relatively low degree of hardness are alternately superposed on each other, has a tenacity which is increased owing to the presence of the second coating layer having the relatively low degree of hardness, so that the hard multilayer coating does not easily suffer from chipping and separation from the substrate. Further, since CrN is not oxidized unless CrN is heated to have a high temperature of about 700° C., the presence of CrN does not deteriorate a heat resistance of the hard multilayer coating. Still further, since the outermost or uppermost layer of the hard multilayer coating is constituted by the first coating layer having the relatively high degree of hardness, the hard multilayer coating has an excellent wear resistance.

The hard multilayer coating defined in the second aspect of the invention, in which the innermost or lowermost layer is constituted by the first coating layer, can be bonded to the substrate with an excellent adhesiveness or bonding strength.

In the hard multilayer coating defined in the third aspect of the invention, the first coating layers has an average thickness of 10–2000 nm while the second coating layer has an average thickness of 10–1000 nm, and the hard multilayer coating has a total thickness of 0.5–20 μm. These dimensional features of the third aspect of the invention is effective to assure prevention of chipping and separation of the multilayer coating owing to the presence of the second coating layer while maintaining wear resistance owing to the presence of the first coating layer.

In the hard multilayer coating defined in the fourth aspect of the invention in which the second coating layer has a composition of mixture of the CrN and $(Ti_x Al_{1-x}) (C_y N_{1-y})$ (wherein $0.20 \leq x \leq 0.60$, $0 \leq y \leq 0.5$), the second coating layers is bonded to the first coating layers with a higher degree of adhesiveness or bonding strength than where the second coating layer is constituted only by the CrN, whereby chipping and separation of the multilayer coating are more reliably prevented.

The hard multilayer coated tool defined in the fifth aspect of the invention provides substantially the same technical advantages as the first through fourth aspects of the invention, and has an improved durability or prolonged service life.

In the method defined in the sixth aspect of the invention, the formation of the first coating layer and the formation of the second coating layer are alternated with each other by switching on and off the first and second arc-discharge power sources, and the thickness of each of the coating layers is adjusted by controlling the arc current supplied from the corresponding arc-discharge power-source and/or the power-on time of the corresponding arc-discharge power source, so that each of the coating layers can be formed to have a desired thickness with high precision.

In the method defined in the seventh aspect of the invention, the first and second arc-discharge power sources are both turned on for thereby forming the second coating layer in the form of a mixed layer having the composition of mixture of CrN and $(Ti_x Al_{1-x}) (C_y N_{1-y})$ (wherein $0.20 \leq x \leq 0.60$, $0 \leq y \leq 0.5$), while the amounts of the arc currents supplied from the respective first and second arc-discharge power sources are controlled for thereby obtaining predetermined proportions of CrN and $(Ti_x Al_{1-x}) (C_y N_{1-y})$ in the mixture composition of the formed second coating layer.

In the method defined in the eighth aspect of the invention, the first and second cathodes are positioned on the respective opposite sides of the substrate in a direction, preferably a horizontal direction, which is perpendicular to the above-described predetermined axis about which the substrate is rotated by the rotary device. Namely, the two cathodes are positioned in their respective positions which are symmetrical with each other with respect to the substrate as viewed in the direction perpendicular to the predetermined axis. Thus, the first and second coating layers can be formed substantially evenly over the entirety of the surface of the substrate.

The present invention may be advantageously applied to a hard multilayer coating to be provided to cover a substrate of any machining tool, which is to be moved relative to a workpiece for thereby machining the workpiece, such as a rotary cutting tool (e.g., an end mill, a drill, a tap and a threading die), a non-rotary cutting tool (e.g., a replaceable insert which is fixed to a tool holder used for a lathe operation) and a cold-forming tool which is designed to form a workpiece into a desired shape by plastically deforming the workpiece. In addition, the present invention may be applied also to a hard multilayer coating to be provided as a surface-protecting coating to cover a body or member which is other than such machining tools. It is noted that the substrate of the machining tool, which is to be coated with the hard multilayer coating, is preferably made of a cemented carbide. However, the tool substrate may be made of other metallic material such as a high-speed tool steel.

As the hard-multilayer-coating forming method according to the present invention, an arc ion plating method is advantageously employed as in the sixth aspect of the invention. However, it is possible to employ other physical vapor deposition (PVD) method such as a sputtering method, or alternatively, a chemical vapor deposition (CVD) method such as a plasma CVD method and a thermal CVD method.

CrN included in the second coating layer may consist of a pure nitride of chromium, or alternatively, may contain C (carbon) and/or B (boron). That is, CrN included in the second coating layer may take also the form of CrCN (carbon nitride of chromium), CrBN (boron nitride of chromium) or CrCBN (carbon boron nitride of chromium).

If the average thickness of the first coating layer is smaller than 10 nm, the hard multilayer coating could not have a sufficient wear resistance. If the average thickness of the first coating layer is larger than 2000 nm, the hard multilayer coating would easily suffer from chipping in spite of the presence of the second coating layer which is superposed on the first coating layers and which has a relatively low degree of hardness. Thus, the average thickness of the first coating layer is preferably 10–2000 nm, more preferably 100–1000 nm. Where the hard multilayer coating includes the plurality of first coating layers, all the first coating layers may have the same thickness or may have respective thickness different from each other. For example, one of the first coating layers which constitutes the outermost layer may have a thickness larger than that of the other first coating layers, for further increasing the wear resistance and heat resistance of the hard multilayer coating. It is also possible to arrange the plurality of first coating layers in an order based on the thicknesses of the respective first coating layers such that a thicker one of the first coating layers whose thickness is larger than that of a thinner one of the first coating layers is disposed outwardly of the thinner one of the first coating layers.

If the average thickness of the second coating layer is smaller than 10 nm, the hard multilayer coating would not be capable of sufficiently absorbing an impact or other force applied to the multilayer coating. If the average thickness of the second coating layer is larger than 1000 nm, the hardness and heat resistance of the entirety of the hard multilayer coating would be deteriorated. Thus, the average thickness of the second coating layer is preferably 10–1000 nm, more preferably 10–500 nm. Where the hard multilayer coating includes the plurality of second coating layers, all the second coating layers may have the same thickness or may have respective thickness different from each other. For example, it is possible to arrange the plurality of second coating layers in an order based on the thicknesses of the respective second coating layers such that a thicker one of the second coating layers whose thickness is larger than that of a thinner one of the second coating layers is disposed outwardly of the thinner one of the second coating layers.

If the total thickness of the hard multilayer coating is smaller than 0.5 $\mu$m, the hard multilayer coating could not have sufficient wear resistance and heat resistance. If the total thickness of the hard multilayer coating is larger than 20 $\mu$m, the hard multilayer coating is likely to easily suffer from chipping and separation from the substrate. Thus, the total thickness of the hard multilayer coating is preferably 0.5–20 $\mu$m, more preferably 1–10 $\mu$m.

While the second coating layer has the composition of mixture of CrN and $(Ti_x Al_{1-x}) (C_y N_{1-y})$ (wherein $0.20 \leq x \leq 0.60$, $0 \leq y \leq 0.5$) in the fourth aspect of the invention, the second coating layer may be constituted only by CrN. Further, $(Ti_x Al_{1-x}) (C_y N_{1-y})$, which is contained in the mixture composition of the second coating layer in the fourth aspect of the invention, may be identical with $(Ti_x Al_{1-x}) (C_y N_{1-y})$ of the composition of the first coating layer, or may be different from $(Ti_x Al_{1-x}) (C_y N_{1-y})$ of the composition of the first coating layer in mixed crystal proportions x, y.

The reaction-gas supplying device defined in the sixth aspect of the invention may have a construction which is determined depending upon the desired composition of the first coating layer. Where the desired composition of the first coating layer is a nitride, the reaction-gas supplying device is constructed to supply, for example, nitrogen gas ($N_2$). Where the desired composition of the first coating layer is a carbide nitride, the reaction-gas supplying device is constructed to supply, for example, nitrogen gas ($N_2$) and hydrocarbon gas ($CH_4$, $C_2H_2$, etc.). In the rotary device defined in the sixth aspect of the invention, the predetermined axis about which the substrate is rotated preferably extends in a vertical direction.

In the method defined in the sixth aspect of the invention, the thickness of the first and second coating layers is increased with increase in the time for which the first and second arc-discharge power sources are held on. Further, the thickness of the coating layers is increased also with increased in amounts of the arc currents supplied from the first and second arc-discharge power sources. Therefore, the thickness of the coating layers can be adjusted by controlling the power-on time of each of the arc-discharge power sources, or by controlling the arc current supplied from each of the arc-discharge power sources. However, the power-on time and the arc current may be both controlled to adjust the thickness of the coating layers. Further, the bias voltage applied to the substrate or other factors may be also taken into account for controlling the thickness of the coating layers.

In the method defined in the seventh aspect of the invention, the substrate is rotated by the rotary device such that CrN and $(Ti_x Al_{1-x}) (C_y N_{1-y})$ (wherein $0.20 \leq x \leq 0.60$, $0 \leq y \leq 0.5$) adhere to the substrate to the substrate in an alternated and repeated manner. In this instance, the construction of the second coating layer varies depending upon a speed at which the substrate is rotated by the rotary device. As to the formation of the first coating layer, $(Ti_x Al_{1-x}) (C_y N_{1-y})$ (wherein $0.20 \leq x \leq 0.60$, $0 \leq y \leq 0.5$) adheres to the substrate in an intermittent manner as a result of the rotation of the substrate.

While the first and second cathodes are positioned on the respective opposite sides of the substrate in the method defined in the eighth aspect of the invention, the positions of the first and second cathodes may be changed as needed, for example, such that the first and second cathodes are positioned adjacently to each other.

BRIEF DESCRIPTION OF THE DRAWINGS

The above and other objects, features, advantages and technical and industrial significance of this invention will be better understood by reading the following detailed description of the presently preferred embodiment of the invention, when considered in connection with the accompanying drawings, in which:

FIG. 4 is a table showing a result of a cutting test in which twenty samples in the form of end mills were tested to cut a workpiece, and indicating a chipped amount in a cutting edge of each end mill and also a worn amount in a peripheral flank face of each end mill.

DETAILED DESCRIPTION OF THE PREFERRED EMBODIMENT

Figure 1A:
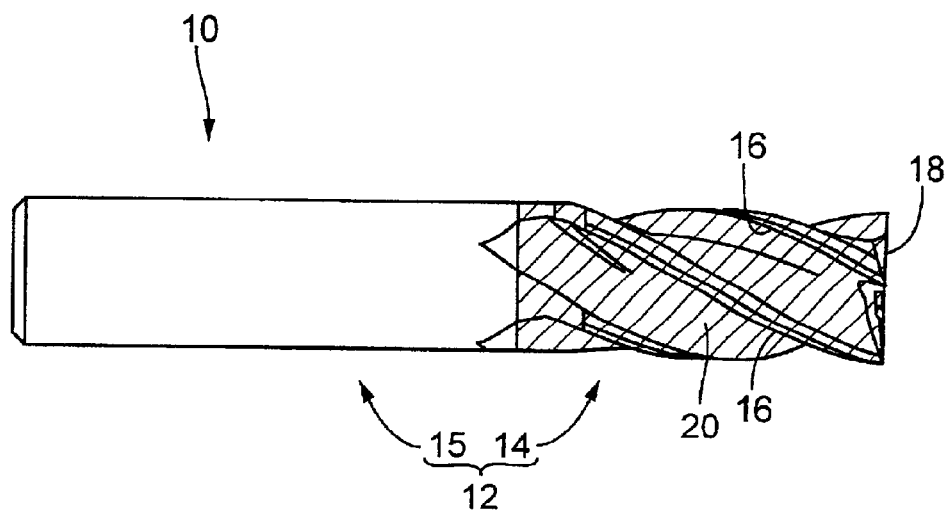
FIG. 1A is an elevational view of a hard multilayer coated tool in the form of an end mill which is constructed according to an embodiment of the present invention.

FIG. 1A is an elevational view of a hard multilayer coated tool in the form of an end mill 10 which is constructed according to an embodiment of the invention. The end mill 10 includes a tool substrate (base material) 12 having a generally cylindrical shape and formed of a cemented carbide. The tool substrate 12 has a cutting teeth portion 14 and a shank portion 15 which are formed integrally with each other. The cutting teeth portion 14, in which helical flutes and cutting teeth are formed, has a surface that is coated with a hard multilayer coating 20. In FIG. 1A, the oblique-lined portion represents a portion of the surface on which the hard multilayer coating 20 is coated. Each of the cutting teeth has a peripheral flank face, a bottom or end flank face and a rake face which is provided by the corresponding one of the helical flutes, so that a peripheral cutting edge 16 and a bottom or end cutting edge 18 are formed in each cutting tooth. The peripheral cutting edge 16 is defined by an intersection of the rake face and the peripheral flank face, while the end cutting edge 18 is defined by an intersection of the rake face and the end flank face. In a cutting operation with this end mill 10, the end mill 10 is rotated about its axis whereby a workpiece is cut by the cutting edges 16, 18.

Figure 1B:
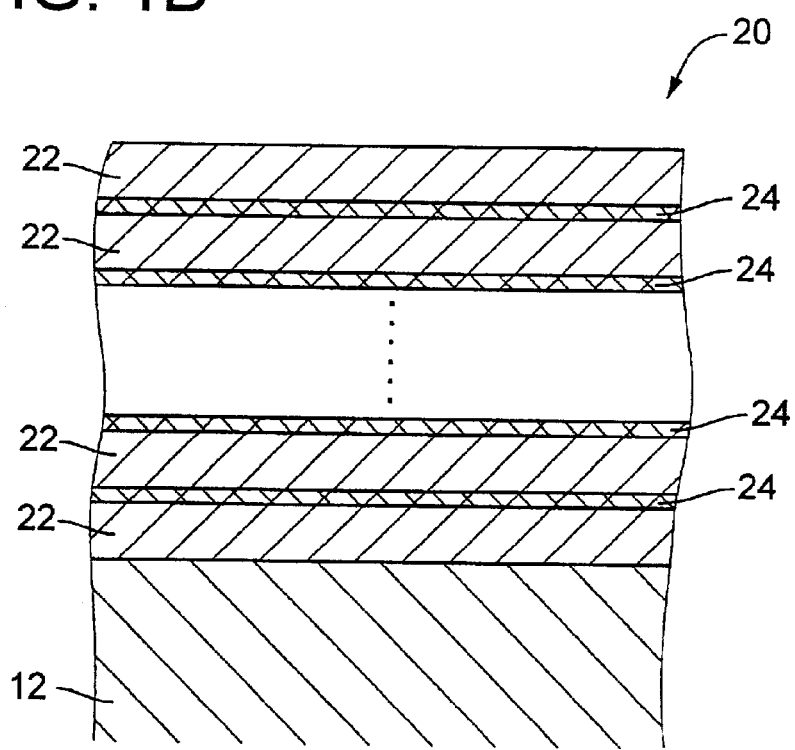
FIG. 1B is a cross sectional view of a cutting teeth portion of the end mill of FIG. 1A, showing a hard multilayer coating which is disposed on the a substrate of the end mill.

As is apparent from FIG. 1B which is a cross sectional view of the cutting teeth portion 14 coated with the hard multilayer coating 20, the hard multilayer coating 20 consists of a plurality of first coating layers 22 and a plurality of second coating layers 24 which are superposed on each other such that the first and second coating layers 22, 24 are alternately arranged in a direction of lamination or superposition of the coating layers 22, 24. The hard multilayer coating 20 has a total thickness of 0.5–20 μm. Each of the first coating layers 22 has a composition represented by $(Ti_x Al_{1-x})(C_y N_{1-y})$ (wherein $0.20 \leq x \leq 0.60$, $0 \leq y \leq 0.5$), and an average thickness of 10–2000 nm. Each of the second coating layers 24 has a composition of mixture of CrN and $(Ti_x Al_{1-x})(C_y N_{1-y})$ (wherein $0.20 \leq x \leq 0.60$, $0 \leq y \leq 0.5$), and an average thickness of 10–1000 nm. $(Ti_x Al_{1-x})(C_y N_{1-y})$, which is contained in the mixture composition of each of the second coating layers 24, is identical with $(Ti_x Al_{1-x})(C_y N_{1-y})$ of the composition of each of the first coating layers 22. CrN included in each of the second coating layers 24 consists of a pure nitride of chromium which contains neither carbon nor boron. The uppermost or outermost layers and the lowermost or innermost layer of the hard multilayer coating 20 are provided by the first coating layers 22, so that the total number of the alternately arranged first and second coating layers 22, 24 is an odd number. While the hard multilayer coating 20 consists of the plurality of first coating layers 22 and the plurality of second coating layers 24 in this embodiment of the invention, the hard multilayer coating of the invention may consist of two first coating layers 22 and one second coating layer 24 which is interposed between the two first coating layers 22 serving as the respective outermost and innermost layers so that the total number of the coating layers 22, 24 is three.

Figure 2:
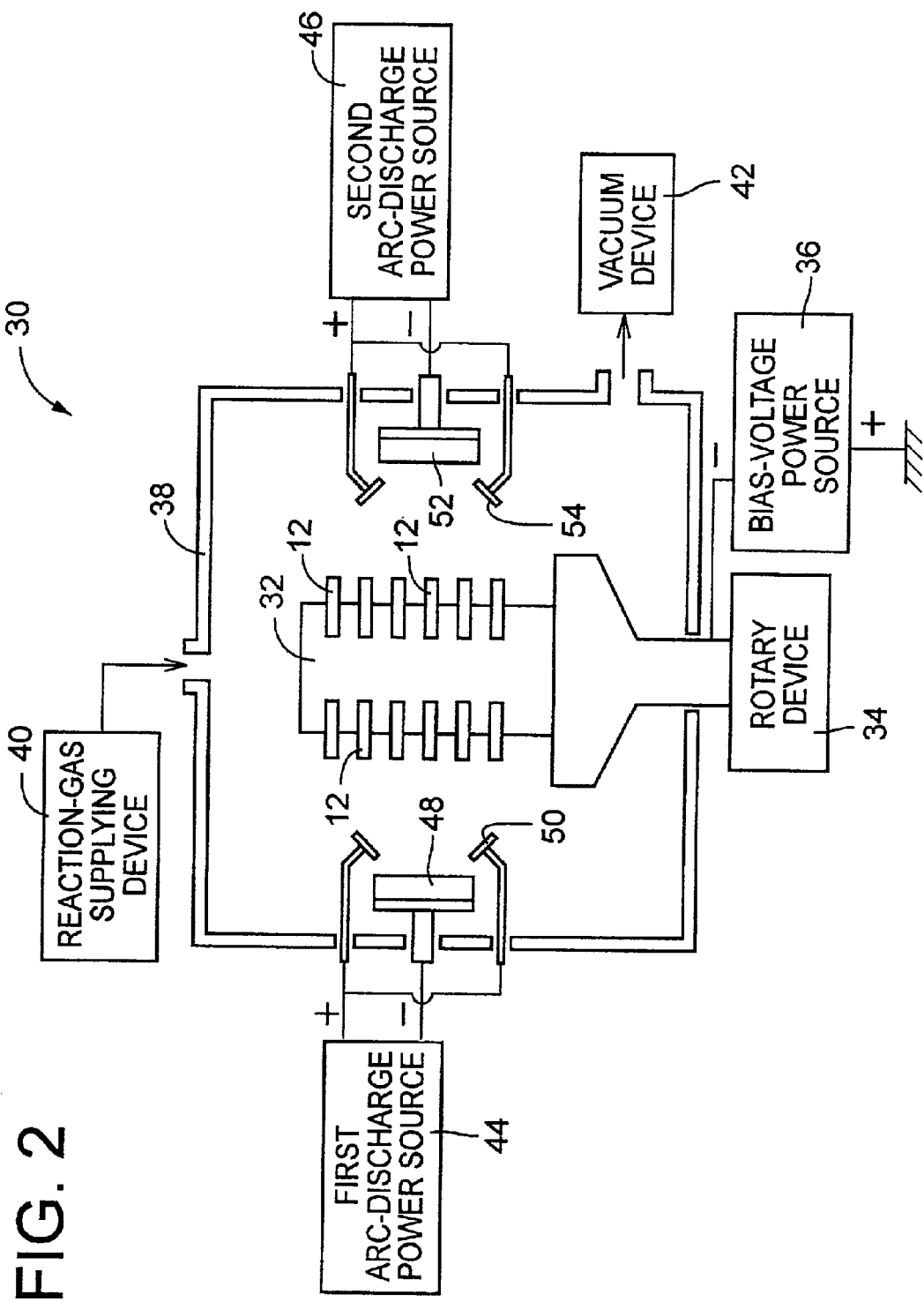
FIG. 2 is a view schematically showing, by way of example, an arc-type ion plating apparatus which can be advantageously used for forming the hard multilayer coating shown in FIG. 1B.

FIG. 2 is a view schematically showing, by way of example, an arc-type ion plating apparatus 30 which can be advantageously used for forming the hard multilayer coating 20. The arc-type ion plating apparatus 30 includes: a holding member 32 for holding a multiplicity of intermediate products in the form of the substrates 12 each of which is not yet coated with the hard multilayer coating 20 and has the peripheral and end cutting edges 16, 18 already formed therein; a rotary device 34 for rotating the holding member 32 about a rotation axis which extends substantially in a vertical direction; a bias-voltage power source 36 for applying a negative bias voltage to the substrates 12; a processing vessel in the form of a chamber 38 which accommodates therein the substrates 12; first and second arc-discharge power sources 44, 46; a reaction-gas supplying device 40 for supplying a reaction gas into the chamber 38; and a vacuum device 42 for sucking a gas in the interior of the chamber 38 with, for example, a vacuum pump so as to reduce the pressure in the interior of the chamber 38. The holding member 32 consists of a cylindrical or prism member having a center at the above-described rotation axis. The multiplicity of substrates 12 are held by the holding member 32 such that each substrate 12 takes a substantially horizontal posture with the cutting teeth portion 14 protruding outwardly in a radial direction of the holding member 32. The reaction-gas supplying device 40 is equipped with tanks in which nitrogen gas ($N_2$) and hydrocarbon gas ($CH_4, C_2H_2$, etc.) are respectively stored. The reaction-gas supplying device 40 is adapted to be activated in accordance with a desired composition of the coating layer. That is, the reaction-gas supplying device 40 supplies the nitrogen gas from the corresponding tank where the desired composition of the first coating layer 22 is TiAlN, while the device 40 supplies the nitrogen gas and the hydrocarbon gas from the respective tanks where the desired composition of the first coating layer 22 is TiAlCN. In the formation of the second coating layer 24 having the composition of mixture of CrN and $(Ti_x Al_{1-x})(C_y N_{1-y})$, which is identical with $(Ti_x Al_{1-x})(C_y N_{1-y})$ of the first coating layer 22, CrN including nitrogen (N) is formed with the supply of the nitrogen gas.

The first arc-discharge power source 44 is connected to an evaporation source in the form of a first cathode 48 which is formed of $Ti_x Al_{1-x}$ (wherein $0.20 \leq x \leq 0.60$) corresponding to the component of the first coating layer 22, and also to a first anode 50. The first arc-discharge power source 44 serves to supply a predetermined amount of an arc current between the first cathode 48 and the first anode 50, for causing arc discharge therebetween, so that $Ti_x Al_{1-x}$ is evaporated from the first cathode 48. The evaporated $Ti_x Al_{1-x}$ becomes metallic ions (positive ions), and then adheres to the substrates 12 to which the negative bias voltage is applied by the bias-voltage power source 36. Similarly, the second arc-discharge power source 46 is connected to another evaporation source in the form of a second cathode 52 which is formed of Cr corresponding to the component of the second coating layer 24, and also to a second anode 54. The second arc-discharge power source 46 serves to supply a predetermined amount of an arc current between the second cathode 52 and the second anode 54, for causing arc discharge therebetween, so that Cr is evaporated from the second cathode 52. The evaporated Cr becomes metallic ions (positive ions), and then adheres to the substrates 12 to which the negative bias voltage is applied by the bias-voltage power source 36. The first and second cathodes 48 and 52 are positioned in their respective positions which are symmetrical with each other with respect to the holding member 32 as viewed in substantially a horizontal direction.

Figure 3:
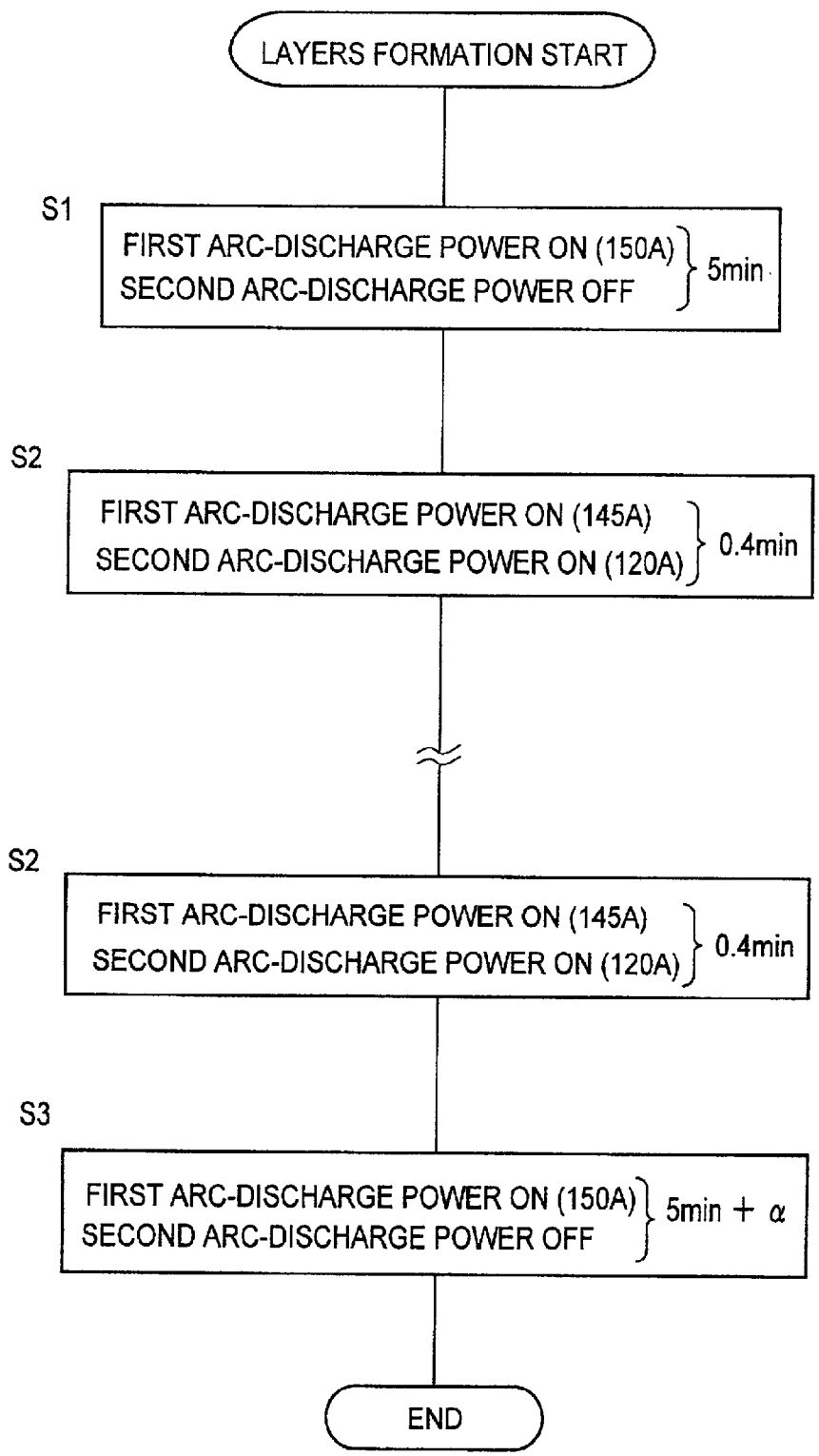
FIG. 3 is a flow chart illustrating a procedure for forming the hard multilayer coating by using the apparatus of FIG. 2.

FIG. 3 is a flow chart illustrating a procedure for forming the hard multilayer coating 20 on a surface of the cutting teeth portion 14 of the substrate 12, by using the arc-type ion plating apparatus 30. Prior to the implementations of steps S1–S3, the pressure in the interior of the chamber 38 is held in a predetermined value (which ranges, for example, from $1.33 \times 5 \times 10^{-1}$ Pa to $1.33 \times 40 \times 10^{-1}$ Pa) by the reaction-gas supplying device 40 and the vacuum device 42, while a predetermined value of the negative bias voltage (which ranges, for example, from −50V to −150V) is applied to the substrates 12 by the bias-voltage power source 36. In this instance, the vacuum device 42 vacuums the chamber 38, and at the same time the reaction-gas supplying device 40 supplies the reaction gas into the chamber 38 in such a manner that holds the pressure in the interior of the chamber 38 in the above-described predetermined value. The steps S1–S3 are then implemented with the rotary device 34 being activated to rotate the holding member 32 at a predetermined number of revolutions (for example, 3 $min^{-1}$), so that the hard multilayer coating 20 is formed on the substrate 12. Such a formation of the hard multilayer coating 20 is carried out under control of a control device including a computer.

In the step S1, the second arc-discharge power source 46 is held off while the first arc-discharge power source 44 is held on so as to supply the arc current of about 150 A between the first cathode 48 and the first anode 50 for about 5 minutes for thereby causing arc discharge therebetween, so that the first coating layer 22 consisting of $(Ti_x Al_{1-x})(C_y N_{1-y})$ and having a predetermined thickness is formed on the substrate 12. The value of the arc current supplied by the first arc-discharge power source 44 and the power-on time for which the first arc-discharge power source 44 is held on are determined based on the desired thickness of the first coating layer 22. Under this condition, i.e, the current value of 150 A and the power-on time of 5 minutes, it is possible to form a coating layer consisting of $Ti_{0.4} Al_{0.6}$ N and having a thickness of about 340 nm as "$(Ti_x Al_{1-x})(C_y N_{1-y})$ layer" (which represents the first coating layer 22) of Sample No. 10 shown in the table of FIG. 4. In the present embodiment, since the substrate 12 as the intermediate product is rotated about the above-described rotation axis which extends substantially in the vertical direction, $Ti_{0.4} Al_{0.6}$ N adheres to the substrate 12 in an intermittent manner.

The step S1 is followed by the step S2, in which the first arc-discharge power source 441 i held on so as to supply the arc current of about 145 A between the first cathode 48 and the first anode 50 for about 0.4 minutes (24 seconds) for thereby causing arc discharge therebetween, while at the same time the second arc-discharge power source 46 is held on so as to supply the arc current of about 120 A between the second cathode 52 and the second anode 54 for the same period (about 0.4 minutes) for thereby causing arc discharge therebetween, so that the second coating layer 24 consisting of the mixture of $(Ti_x Al_{1-x})(C_y N_{1-y})$ and CrN and having a predetermined thickness is formed on the first coating layer 22 which has been formed as described above. The values of the arc currents supplied by the respective first and second arc-discharge power sources 44, 46 are determined based on the desired proportions of $(Ti_x Al_{1-x})(C_y N_{1-y})$ and CrN and the desired thickness of the second coating layer 24. The power-on times of the first and second arc-discharge power sources 44, 46 are determined based on the desired thickness of the second coating layer 24. Under this condition, it is possible to form a coating layer consisting of the mixture of $Ti_{0.4} Al_{0.6}$ N and CrN and having a thickness of about 20 nm as "CrN mixture layer" (which represents the second coating layer 24) of Sample No. 10 shown in the table of FIG. 4. In the present embodiment, since the substrate 12 as the intermediate product is rotated about the above-described rotation axis which extends substantially in the vertical direction, $Ti_{0.4} Al_{0.6}$ N and CrN adhere to the substrate 12 in an alternated and repeated manner while being partially mixed with each other.

The above-described steps S1 and S2 are implemented by a predetermined number (n−1) of times, wherein the predetermined number is smaller than the total number (n) of the first and second coating layers 22, 24 by one (1). After the predetermined number (n−1) of times of implementations of the steps S1, S2, the step S3 is implemented to form the first coating layer 22 as the outermost layer. For example, in the case of the Sample No. 10 in the table of FIG. 4 in which the total number of the first and second coating layers 22, 24 is fifteen, the steps S1 and S2 are alternately implemented fourteen times, for thereby alternately forming the first and second coating layers 22, 24. After the formations of the seven first coating layers 22 having the respective thicknesses equal to each other and the seven second coating layers 24 having the respective thicknesses equal to each other, the step S3 is implemented. In the step S3, the time for the formation of the first coating layer 22, i.e., the power-on time for which the first arc-discharge power source 44 is held on is longer than in the step S1 by a predetermined time α, by which the thickness of the first coating layer 22 formed in the step S3 is larger than that of the first coating layer 22 formed in the step S1. Thus, the implementation of the step S3 provides, as the outermost layer, the first coating layer 22 having excellent heat resistance and wear resistance. It is noted that, in the column of "Thickness (nm)" of "$(Ti_x Al_{1-x})(C_y N_{1-y})$ layer" in the table of FIG. 4, the value indicated on the right side of "/(slash)" represents the thickness of the first coating layer 22 as the outermost layer, while the value indicated on the left side of "/(slash)" represents the thickness of the first coating layer 22 as the layer other than the outermost layer.

In the present embodiment of the invention, $(Ti_x Al_{1-x})(C_y N_{1-y})$ (wherein $0.20 \leq x \leq 0.60$, $0 \leq y \leq 0.5$) constituting each of the first coating layers 22 has a hardness (Hv) of about 2300–3000, while CrN has a hardness (Hv) of about 1800–2000. Thus, each of the second coating layers 24 consisting of the mixture of $(Ti_x Al_{1-x})(C_y N_{1-y})$ and CrN has a hardness smaller than that of each of the first coating layers 22. The hard multilayer coating 20 in which the first coating layers 22 having the relatively high degree of hardness and the second coating layers 24 having the relatively low degree of hardness are alternately superposed on each other, has a tenacity which is increased owing to the presence of the second coating layers 24 having the relatively low degree of hardness, so that the hard multilayer coating 20 does not easily suffer from chipping and separation from the substrate 12, and accordingly has an improved durability or prolonged service life.

Further, each of the first coating layers 22 has the average thickness of 10–2000 nm while each of the second coating layers 24 has the average thickness of 10–1000 nm, and the hard multilayer coating 20 has the total thickness of 0.5–20 μm. These dimensional features are effective to assure prevention of chipping and separation of the multilayer coating 20 owing to the presence of the second coating layers 24 while maintaining wear resistance owing to the presence of the first coating layers 22.

Further, since the outermost layer of the hard multilayer coating 20, i.e., the outer surface of the multilayer coating 20 is constituted by one of the first coating layers 22 having the relatively high degree of hardness, the hard multilayer coating 20 has an excellent wear resistance. Particularly, in the present embodiment in which the one of the first coating layers 22 constituting the outermost layer has the thickness larger than that of the others of the first coating layers 22, the hard multilayer coating 20 has a further excellent wear resistance.

Further, in the present embodiment of the invention, since the innermost layer which is held in contact with the substrate 12 is also constituted by one of the first coating layers 22 consisting of $(Ti_x Al_{1-x})(C_y N_{1-y})$, the hard multilayer coating 20 can be bonded to the substrate 12 with an excellent adhesiveness or bonding strength, whereby the separation of the multilayer coating 20 from the substrate 12 is more effectively prevented.

Further, since each of the second coating layers 24 has a composition of mixture of CrN and $(Ti_x Al_{1-x})(C_y N_{1-y})$, the second coating layers 24 are bonded to the first coating layers 22 with a higher degree of adhesiveness or bonding strength than where each second coating layer 24 is constituted only by the CrN, whereby chipping and separation of the multilayer coating 20 are more reliably prevented. CrN is not oxidized unless CrN is heated to have a high temperature of about 700° C., so that the presence of CrN does not deteriorate the heat resistance of the hard multilayer coating 20.

Further, in the present embodiment of the invention, the formation of each first coating layer 22 and the formation of each second coating layer 24 are alternated with each other by switching on and off the first and second arc-discharge power sources 44, 46, and the thickness of each of the coating layers 22, 24 is adjusted by controlling the corresponding arc current value and the power-on time of the corresponding arc-discharge power source, so that each of the coating layers 22, 24 can be formed to have the desired thickness with high precision.

Further, the first and second arc-discharge power sources 44, 46 are both turned on for thereby forming the second coating layer 24 in the form of a mixed layer having the composition of mixture of CrN and $(Ti_x Al_{1-x}) (C_y N_{1-y})$, while the amounts of the arc currents supplied from the respective first and second arc-discharge power sources 44, 46 are controlled for thereby easily obtaining predetermined proportions of CrN and $(Ti_x Al_{1-x}) (C_y N_{1-y})$ in the mixture composition of the formed second coating layer 24.

Further, in the present embodiment of the invention, the first and second cathodes 48, 52 are positioned on the respective opposite sides of the holding member 32 in substantially the horizontal direction, while the holding member 32 is rotated by the rotary device 34 about the rotation axis which extends in substantially the vertical direction. This arrangement is effective to make it possible to form the first and second coating layers 22, 24 substantially evenly over the entirety of the surface of the substrate 12.

A cutting test was conducted by using, as Samples 1–20, twenty square end mills each having two teeth and a diameter of 10 mm. The substrates of the these end mills are made of cemented carbide, and are coated with respective coatings different from each other, as indicated in the table of FIG. 4. Samples 1–15 are examples of the present invention. Samples 16 and 17 are comparative examples in each of which the coating consists of a single layer coating formed of only CrN. Samples 18–20 are conventional examples in each of which the coating consists of a single layer coating formed of only TiAlN. In the test, after a workpiece had been cut at its side surface by each of the end mills over a distance of 50 m under a cutting condition as specified below, a chipped amount in the peripheral and end cutting edges and also a worn amount in the peripheral flank faces were checked. The chipped amount in the cutting edges of each end mill is categorized into "MUCH", "SOME" or "LITTLE", as indicated in the column of "Chipping" of the table of FIG. 4. "MUCH" indicates that the corresponding sample considerably suffered from chipping during the cutting operation of the test, and that the corresponding sample is not suitable for the use under the below-specified cutting condition and accordingly is not marketable as a product. "SOME" indicates that the corresponding sample somewhat suffered from chipping to such an extent that does not unable the sample to be marketable. "LITTLE" indicates that the corresponding sample never or little suffered from chipping so that the chipped part did not exist or was too small to be visually confirmed.
[Cutting Condition]
Workpiece: SKD61 (50HRC)
Number of revolutions: 5000 min$^{-1}$ (157 m/min)
Feed rate: 426 mm/min (0.043 mm/tooth)
Depth of cut: RD (Radial depth)=10 mm
AD (Axial depth)=0.2 mm
Cutting fluid: Dry cutting with application of air blow
Used milling machine: Horizontal type machining center As is apparent from the result of the cutting test indicated in the table of FIG. 4, in the examples of the invention (Samples 1–15), the cutting edges were chipped "LITTLE" or "SOME", and the peripheral flank faces were worn over a width not larger than about 0.1 mm. Thus, each of Sample 1–15 exhibited a sufficiently high degree of durability for a practical use. On the other hand, in the comparative examples (Samples 16 and 17) in each of which the substrate is coated with the single-layer coating consisting only of CrN, the cutting edges were chipped "LITTLE", while the peripheral flank faces were worn over a considerably large width of about 0.4 mm. Thus, each of Samples 16 and 17 did not exhibit a sufficiently high degree of durability or wear resistance. In the conventional examples (Samples 18–20) in each of which the substrate is coated with the single-layer coating consisting only of TiAlN, the cutting edges were chipped "MUCH", and the peripheral flank faces were worn over a width not smaller than 0.15 mm. It is considered that the cutting edges were easily chipped upon application of impact thereto during the cutting operation, and that the wear of the peripheral flank faces developed from the chipped parts of the cutting edges. Thus, each of Samples 18–20 exhibited a poor durability.

While the presently preferred embodiment of the present invention has been illustrated above, it is to be understood that the invention is not limited to the details of the illustrated embodiment, but may be embodied with various other changes, modifications and improvements, which may occur to those skilled in the art, without departing from the spirit and scope of the invention defined in the following claims.

What is claimed is:

1. A hard multilayer coating comprising first and second coating layers which are alternately superposed on each other, and a base material which is covered by said first and second coating layers, wherein said first coating layer consists of a plurality of first coating layers and said second coating layer consists of at least one second coating layer, wherein each first coating layer consists of $(Ti_x Al_{1-x}) (C_y N_{1-y})$ wherein $0.20 \leq x \leq 0.60$, $0 \leq y \leq 0.5$, while each second coating layer includes or consists of CrN, and wherein one first coating layer constitutes an outermost layer of said first and second coating layers, while another first coating layer constitutes an innermost layer of said first and second coating layers, and is held in contact with said base material.

2. A hard multilayer coating according to claim 1, wherein each first coating layer has an average thickness of 10–2000 nm while each second coating layer has an average thickness of 10–1000 nm, and wherein said hard multilayer coating has a total thickness of 0.5–20 μm.

3. A hard multilayer coating according to claim 1, wherein each second coating layer further includes $(Ti_x Al_{1-x}) (C_y N_{1-y})$ wherein $0.20 \leq x \leq 0.60$, $0 \leq y \leq 0.5$.

* * * * *